United States Patent [19]
Cadet et al.

[11] Patent Number: 5,510,007
[45] Date of Patent: Apr. 23, 1996

[54] ELECTROCHEMICAL GENERATION OF SILANE

[75] Inventors: Gardy Cadet; Ronald A. Holland, both of Orange; James W. Mitchell, Somerset; Jorge L. Valdes, Bedminster, all of N.J.

[73] Assignee: AT&T Corp., Murray Hill, N.J.

[21] Appl. No.: 299,701

[22] Filed: Aug. 31, 1994

[51] Int. Cl.[6] .............................. C25B 1/00; C23C 16/00; H05H 1/02; H05H 1/24

[52] U.S. Cl. .......................... 205/549; 427/255; 427/574; 427/578

[58] Field of Search .................................. 204/59 R, 101; 427/255, 574, 578

[56] References Cited

U.S. PATENT DOCUMENTS 5,246,744  9/1993  Matsuda et al. ...................... 427/574

FOREIGN PATENT DOCUMENTS 3211293  9/1991  Japan .

*Primary Examiner*—John Niebling
*Assistant Examiner*—Edna Wong
*Attorney, Agent, or Firm*—Richard J. Botos

[57] ABSTRACT

The present invention provides improved processes and apparatus for fabrication of articles having silicon-containing regions. The process comprises generating silane by electrochemical reaction with a silicon-containing precursor material. An electrochemical cell generates $H^+$ species which react with silicon from the precursor material to form a silane. The silane is used to deposit a silicon-containing article region. An apparatus for fabricating an article having a silicon-containing region is also provided. The fabrication system includes a reaction chamber having a gas supply line communicating with a silane-generating electrochemical cell. The electrochemical cell includes a first electrode for generating a supply of $H^+$ ions, a silicon-containing precursor material in communication with the first electrode, a second electrode, and a receptacle for retaining an electrolyte. Advantageously, the present invention eliminates the need for long-term storage and transport of silane by generating silane at the site of device fabrication.

9 Claims, 2 Drawing Sheets

ELECTROCHEMICAL GENERATION OF SILANE

TECHNICAL FIELD OF THE INVENTION

The present invention relates to electrochemical generation of silane and, more particularly, to the electrochemical generation of silane at the site of the silane usage such that long-term storage of silane is substantially eliminated.

DESCRIPTION OF THE RELATED ART

Silane is used as a precursor gas for the deposition of silicon and silicon-containing compounds and alloys in numerous commercial processes relating to device fabrication. Silicon from decomposed silane is an important constituent in semiconductor devices, waveguiding components, and photoconductive devices such as solar cells and xerography drums, to name a few. Silane is typically produced in bulk quantities by reacting silicon tetrafluoride ($SiF_4$), with sodium aluminum tetrahydride ($NaAlH_4$), potassium aluminum tetrahydride ($KAlH_4$), or mixtures thereof, preferably in an inert liquid medium comprising an ether. Early methods of producing silane involved reaction of magnesium silicide ($Mg_2Si$) with hydrochloric acid according to the reaction:

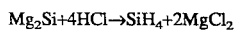

$$Mg_2Si + 4HCl \rightarrow SiH_4 + 2MgCl_2$$

Silane produced in this manner must be transported from the location of bulk manufacture to the silane purification and packaging plant and finally to its site of consumption. Because silane is highly pyrophoric and toxic, numerous safety precautions must be taken in order to convey silane to its ultimate destination. For large-scale users, silane is supplied in tube trailers which must be stored at a protected site on premises. Thus, the transport of silane is a costly and hazardous procedure.

Attempts have been made to circumvent the hazards associated with silane transport and storage by generating silane at the site of usage as it is needed. However, such silane generators have typically been limited to the formation of high-energy hydrogen species, such as generated by plasma or electron-beam excitation of hydrogen gas, which react with a silicon source material to create silane. While such techniques produce small to moderate quantities of silane, they are generally too complex or produce insufficient amounts to satisfy the needs of a large-scale production facility.

Thus, there is a need in the art for processes and apparatus which generate silane at the site of silane usage. Such processes and apparatus could be used to supply silane on demand, without the need for long-term storage or transport of silane.

SUMMARY OF THE INVENTION

The present invention provides improved processes and apparatus for fabrication of articles having silicon-containing regions, i.e., regions which include epitaxial, polycrystalline, or amorphous silicon in an elemental, compound, or alloy form. The process comprises generating silane by electrochemical reaction with a silicon-containing precursor material. An electrochemical cell generates $H^+$ species which then react with silicon from the precursor material to form a silane. Alternatively, silane is produced by direct electrochemical operation on a suitable electrode constructed from a silicon-containing precursor material. The silane is used to deposit a device region which includes elemental silicon, a silicon alloy, or a silicon compound.

In another aspect, the present invention provides a vapor deposition apparatus having an in situ silane-generating capability. The vapor deposition apparatus includes a reaction chamber having a gas supply line communicating with a silane-generating electrochemical cell. The electrochemical cell includes a first electrode, a silicon-containing precursor material in contact with the first electrode, means for generating a supply of $H^+$ ions, a second electrode, and a receptacle for retaining an electrolyte. Advantageously, the present invention eliminates the need for long-term storage and transport of silane by generating silane at the site of device fabrication.

DETAILED DESCRIPTION

Figure 1:
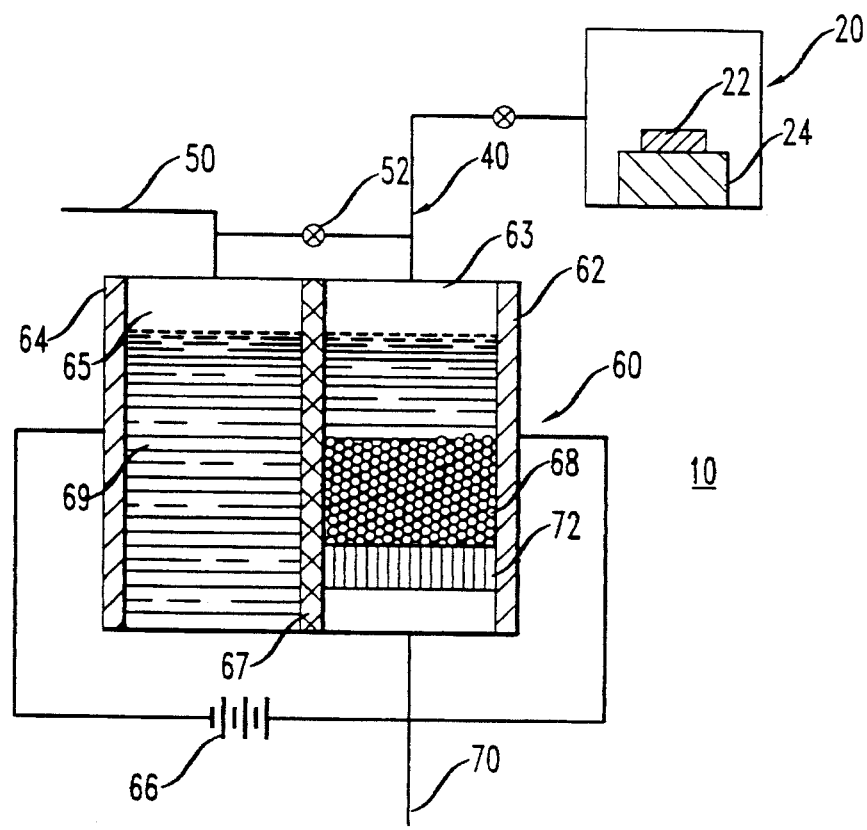
FIG. 1 is a schematic representation of a device fabrication system according to the present invention.

Turning now to the drawings in detail in which like numerals represent the same or similar elements in each of the several views, FIG. 1 illustrates a device fabrication system 10 according to a first embodiment of the present invention. Device fabrication system 10 includes reaction chamber 20 for the decomposition of silane to produce a silicon-containing device region. A silane gas supply line 40 connects to reaction chamber 20 and communicates with silane-generating electrochemical cell 60.

Reaction chamber 20 thermally decomposes silane to yield silicon which is deposited in elemental, alloy, or compound form on substrate 22. Heating element 24 provides the thermal energy for silane dissociation and is selected from heating elements including, but not limited to, radiant heaters, resistive heaters, inductive heaters, r.f. heaters, and microwave heaters.

Figure 2:
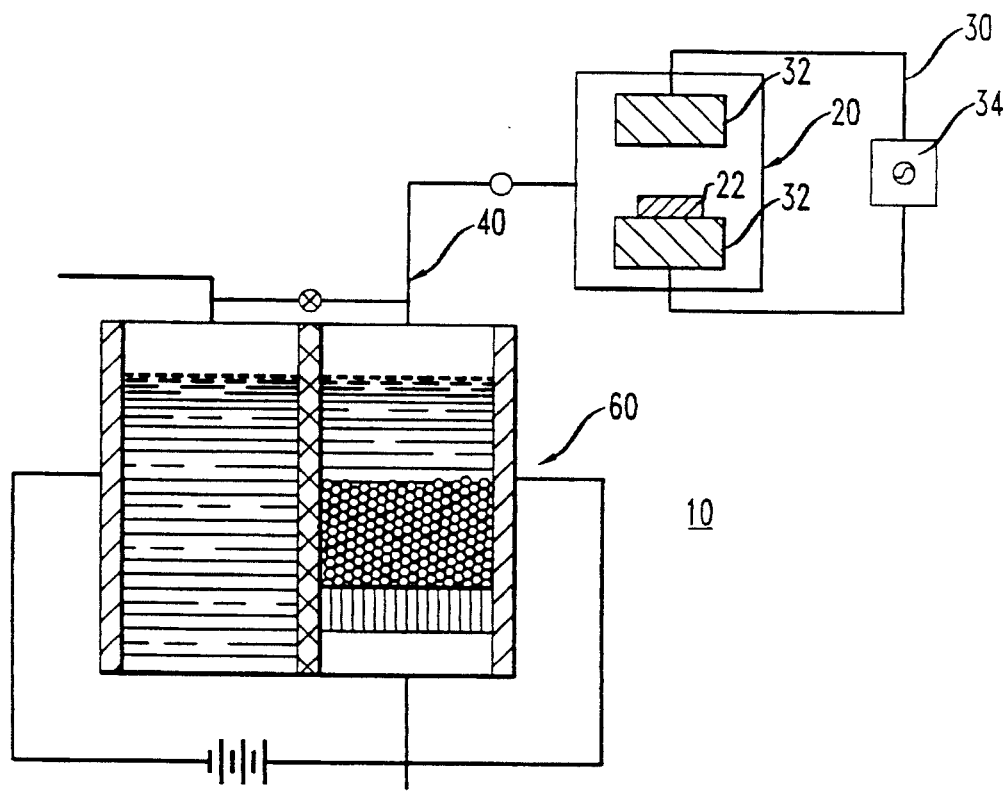
FIG. 2 is a schematic representation of a device fabrication system according to a further embodiment of the present invention.
Figure 3:
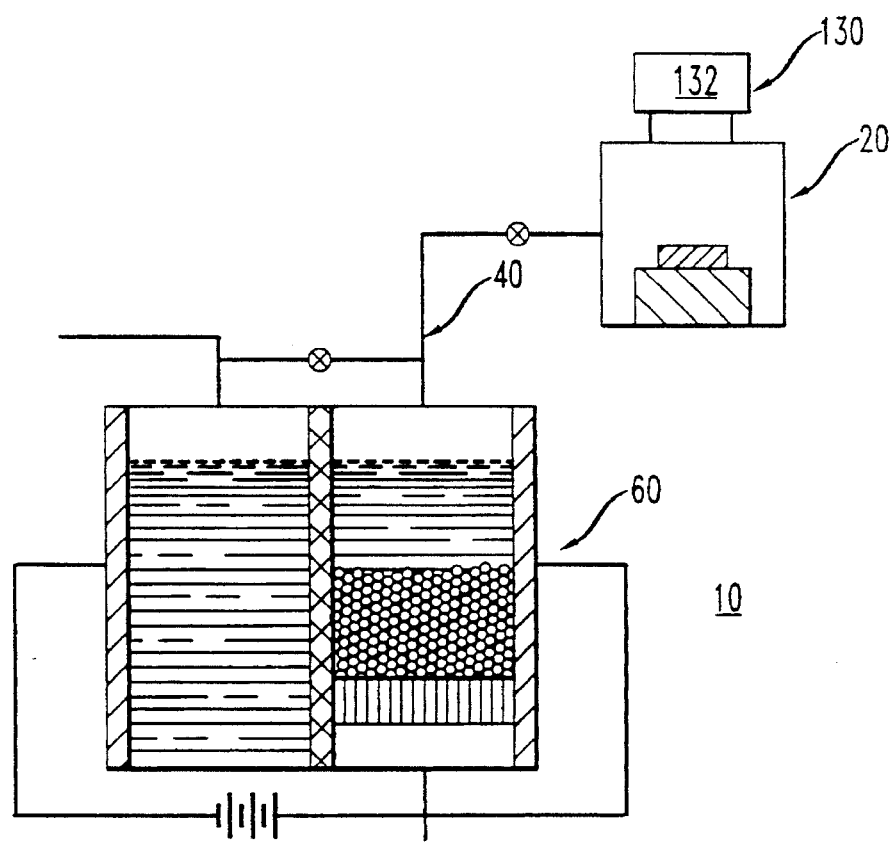
FIG. 3 is a schematic representation of a device fabrication system according to a further embodiment of the present invention.
Figure 4:
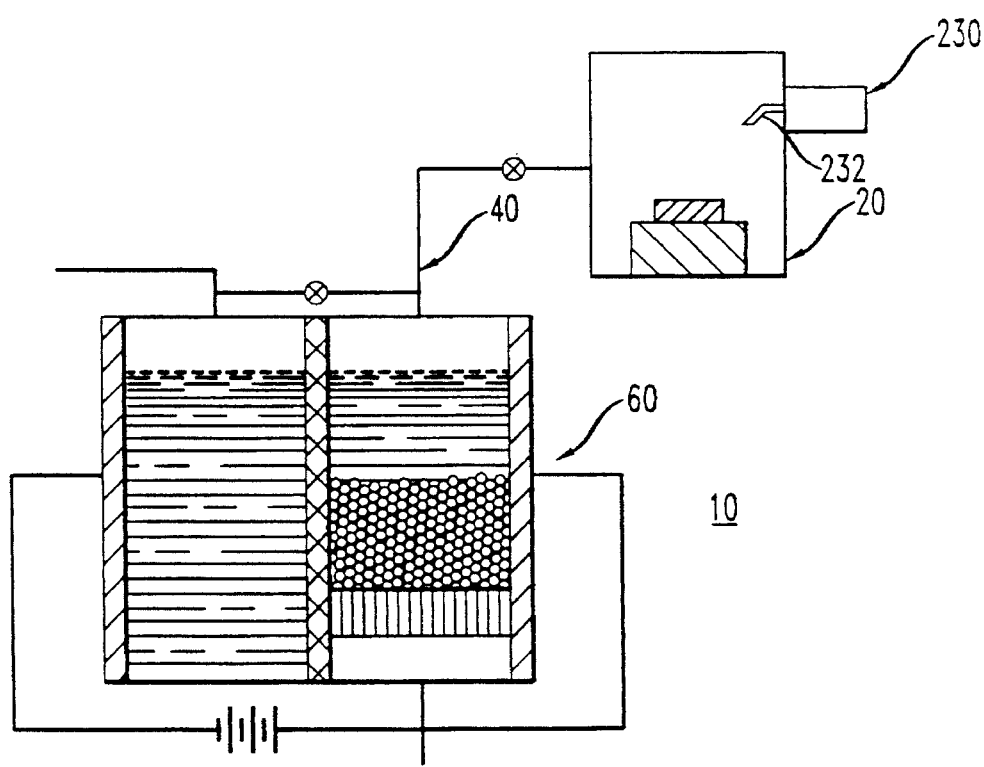
FIG. 4 is a schematic representation of a device fabrication system according to a further embodiment of the present invention.

Numerous configurations of the reaction chamber 20 are used to decompose silane in a variety of ways. In FIG. 2, reaction chamber 20 includes a plasma-generating system 30. Plasma-generating system 30 includes parallel-plate electrodes 32 connected to r.f. power source 34. In FIG. 3, reaction chamber 20 includes microwave plasma-generating system 130 comprising microwave generator 132. In FIG. 4, reaction chamber 20 includes a photolysis system 230 comprising a photolytic source such as a mercury arc lamp or U.V. laser 232. It will be appreciated that the silane decomposition systems of FIGS. 1–4 are only exemplary. Any system which decomposes silane to yield a silicon-containing reaction product can be used in conjunction with reaction chamber 20.

Reaction chamber 20 typically includes other gas supply lines (not shown), for delivering other reactant or inert gases. When the silicon deposition occurs at reduced pressures, the reaction chamber is connected to a vacuum source (not shown). The reaction chamber is constructed from a relatively inert metal, such as stainless steel, which can withstand the pressures associated with vacuum deposition. Additional features of reaction chamber construction and gas decomposition systems are set forth in Hitchman and Jensen, *Chemical Vapor Deposition* (Academic Press, 1993) and Middleman and Hochberg, *Process Engineering Analysis in Semiconductor Device Fabrication,* (McGraw-Hill, 1993), the disclosures of which are incorporated herein by reference.

Electrochemical cell 60 generates silane through reaction of electrochemically-produced $H^+$ ions with a silicon-containing precursor material. Cell 60 comprises anode 62 and cathode 64 connected to a suitable direct current power supply, schematically illustrated as element 66. Fluid-permeable barrier 67 separates anode 62 and cathode 64, forming anode compartment 63 and cathode compartment 65. Aqueous electrolyte 69 circulates through barrier 67. Depending upon the selected electrochemical reaction, barrier 67 is an ion-selective membrane which controls the charged species exchange between the anode and cathode compartments.

While the electrode configuration is illustratively depicted as opposed parallel plates, numerous other electrode geometries can be employed in electrochemical cell 60. In general, any electrode configuration which promotes uniform distribution of the current density throughout the electrode is acceptable. A cylindrical electrode surrounding a rod electrode is an example of such a configuration. Although two electrodes are sufficient for gas generation, configurations which include plural cathodes and anodes are optionally used to increase the production rate of silane.

Silicon-containing precursor material 68 is positioned adjacent to anode 62. Hydrogen to be oxidized at the anode is fed through hydrogen feed line 70 via distributor 72 into anode compartment 63. The generated silane exits anode compartment 63 through gas supply line 40 while gaseous cathodic reaction products are vented through vent line 50. Alternatively, the generated silane communicates with reaction chamber 20 through a temporary storage container which inputs silane into gas supply line 40.

In an exemplary embodiment, the silicon-containing precursor material is formed within a three-dimensional packed-bed electrode. When using a conductive silicon-containing precursor material, the silicon-containing material comprises the entirety of the packed-bed electrode. Magnesium silicide is an example of such a material. Advantageously, this approach employs the silicon-containing material both as the silane precursor and as an electrode material for oxidizing hydrogen gas. When using poorly-conducting or insulating silicon-containing precursor material in a packed-bed electrode configuration, conductive particles are admixed with the silicon-containing material. The conductive particles, e.g., conductive metals, are selected for their ability to electrochemically oxidize $H_2$ gas to produce $H^+$ ions. The $H^+$ ions in turn react with the adjacent silicon-containing precursor material to produce a silane.

For typical current densities, a water mist is produced by the generated gas bubbling through the electrolyte and by heating of the electrolyte. It is desirable to suppress this mist generation, especially in device fabrication techniques sensitive to water. Therefore, conventional expedients, such as mist suppressors, are optionally incorporated in the electrochemical cell of the present invention. Molecular sieve material, such as 3A molecular sieve having a nominal pore diameter of 3 Angstroms, can also be used to effectively reduce the moisture content of the effluent stream.

A representative reaction uses magnesium silicide, $Mg_2Si$, as the silicon-containing precursor material 68. Magnesium silicide forms silane according to the reaction:

$$Mg_2Si + 4H^+ \rightarrow SiH_4 + 2Mg^{2+} \qquad (1)$$

Because magnesium silicide is electrically conductive, it acts as an electrode as well as a silicon-containing precursor material when placed in a packed-bed configuration in contact with the anode.

At the anode, hydrogen is oxidized to form hydrogen ions according to the reaction:

$$H_2 \rightarrow 2H^+ + 2e^- \qquad (2)$$

Since this reaction requires the potential generated by the anode to proceed, the evolution of $H^+$ ions is readily controlled through control of the power supply to the anode. Because silane generation requires these $H^+$ ions, silane production is also controlled through the power supply. As a result, silane is produced only "on-demand" by initiating current flow to the electrodes, while silane production ceases after the current flow is discontinued. Advantageously, this reaction control prevents accumulation of unwanted silane, eliminating the need for long-term storage of silane.

Because silane reacts violently with oxygen, it is critical to suppress molecular oxygen generation at the anode. Ordinarily, oxygen is produced at the anode in aqueous electrochemical systems according to the reaction:

$$2H_2O \rightarrow O_2 + 4H^+ + 4e^- \qquad (3)$$

However, oxidation of hydrogen according to equation (2) is greatly thermodynamically preferred to the oxidation reaction of equation (3). When sufficient hydrogen is available, reaction (2) will always take precedence over reaction (3). As a safety precaution, fabrication system 10 is optionally provided with an interlock switch which prevents the activation of the power supply unless hydrogen is supplied to anode compartment 63. Additional protection is optionally provided by a supplemental anode (not shown) which consumes undesired oxygen within anode compartment 63. Suitable materials for construction of such an anode are metals having a high oxygen affinity such as molybdenum. The supplemental anode further benefits the electrochemical cell by providing additional hydrogen oxidation capability.

For silane production from magnesium silicide, magnesium ions flow from the anode to the cathode to provide charge transfer between the anode and the cathode. To create a single-path flow between the anode and cathode, fluid-permeable barrier 67 is a cation exchange membrane compatible with the selected electrolyte. Magnesium ions flow from anode compartment 63 through cation exchange membrane 67 into cathode compartment 65.

For the magnesium silicide electrochemical cell, the cathode electrolyzes water from aqueous electrolyte 69 according to the reaction:

$$2H_2O + 2e^- \rightarrow H_2 + 2OH^- \qquad (4)$$

The $H_2$ gas produced from this reaction is vented through vent line 50. Optionally, since hydrogen is an acceptable carrier gas for silane, the cathodic hydrogen reaction product can be vented through valve 52 into silane supply line ! 40. Alternatively, the hydrogen can be recirculated into hydrogen supply line 70 for electrochemical oxidation at the anode.

To preclude reaction with the silane generated in the anode compartment, the hydroxyl ions generated at the cathode should remain in the cathode compartment. When barrier 67 is a cation exchange membrane, such as NAFION™ ion exchange membrane, available from DuPont, the transport of hydroxyl ions from the cathode to the anode compartment is minimized.

To remove excess hydroxyl ions adjacent 16 the cathode portion of the electrochemical cell, a consumable material is optionally positioned within the cathode compartment (not shown). Removal of excess hydroxyl ions decreases the supply available to react with magnesium ions, thereby reducing the reaction product $Mg(OH)_2$ which can precipitate on the cathodic electrode. Aluminum is an exemplary material which consumes hydroxyl ions according to the reaction:

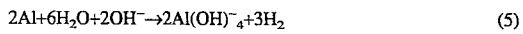

$$2Al + 6H_2O + 2OH^- \rightarrow 2Al(OH)_4^- + 3H_2 \qquad (5)$$

This reaction proceeds spontaneously and is used to deplete hydroxyl ions when the electrochemical cell is not being used to generate silane. During silane production, reaction (5) is permitted to proceed spontaneously or a cathodic potential is applied to the aluminum to impede the reaction, depending upon the desired concentration of $OH^-$. Typically, the life cycle of the sacrificial aluminum is on the order of the life cycle of the silicon-containing precursor material.

For the magnesium silicide electrochemical cell, the aqueous electrolyte advantageously includes a constituent which reacts with the generated magnesium ions. Suitable materials are acids which dissociate to yield anions reactive with the magnesium cation. The electrolyte constituent desirably meets solubility limits for by-products of the anode and cathode reactions, is non-oxidizing and electrochemically inert, and has minimal acid/base buffering capacity. Many chloride and sulfate-based acids possess these characteristics. An exemplary acid is trifluoromethanesulfonic acid, also known as triflic acid, which combines with magnesium ions according to the reaction:

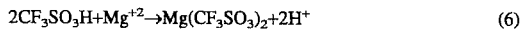

$$2CF_3SO_3H + Mg^{+2} \rightarrow Mg(CF_3SO_3)_2 + 2H^+ \qquad (6)$$

The magnesium product from reaction (6) is soluble in the electrolyte and is non-adherent to the electrode surface. Advantageously, hydrogen ion generation in the anode compartment is enhanced through the use of triflic acid in the electrolyte.

Other electrolyte constituents for use with magnesium silicide precursor materials are salts including thiosulfates, e.g., potassium thiosulfate and selenates.

While the foregoing reaction has been described in terms of a magnesium silicide precursor material, it will be appreciated that numerous other silicon-containing precursors are suitably employed in electrochemical cell 60. Any precursor material reactive with hydrogen ions to yield silane and which includes a species capable of charge transport through the electrochemical cell is acceptable as the silicon-containing precursor.

While the foregoing invention has been described in terms of the above detailed embodiments, it will be readily apparent that numerous modifications of the device fabrication system and method may be made. Accordingly, modifications such as those suggested above, but not limited thereto, are considered to be within the scope of the claimed invention.

What is claimed is:

1. A process for fabrication of an article having at least one article region including elemental silicon, a silicon alloy, or a silicon compound, the process comprising:

generating a silane by electrochemical reaction of a solid precursor material including silicon in an electrochemical cell which generates $H^+$ species, the generated $H^+$ species reacting with silicon from the precursor material to form a silane, using the silane to deposit an article region which includes elemental silicon, a silicon alloy, or a silicon compound.

2. A process for fabrication of an article according to claim 1 further comprising transporting the generated silane between the electrochemical cell and an apparatus for depositing an article region which includes elemental silicon, a silicon alloy, or a silicon compound.

3. A process for fabrication of an article according to claim 1 wherein the precursor material is a silicide.

4. A process for fabrication of an article according to claim 3 wherein the silicide is magnesium silicide.

5. A process for fabrication of an article according to claim 1 wherein the deposition of an article region which includes elemental silicon, a silicon alloy, or a silicon compound is performed by decomposition of the silane through heating, plasma excitation, or photolysis.

6. A process for fabrication of an article according to claim 1 wherein the article is selected from semiconductor devices, waveguiding components, and photoconductive devices.

7. A process for fabrication of an article according to claim 1 wherein the precursor material forms a packed-bed electrode in the electrochemical cell.

8. An apparatus for fabrication of a device having at least one region including elemental silicon, a silicon alloy, or a silicon compound, the apparatus comprising:

a reaction chamber for deposition of elemental silicon, a silicon alloy, or a silicon compound, the reaction chamber including a component for dissociation of a silane, the dissociation component selected from heating elements, plasma-generating electrodes, microwave plasma generators, and photolyzers;

a gas supply line connected to the reaction chamber for supplying a silane to the reaction chamber; and an electrochemical cell communicating with the gas supply line, the electrochemical cell comprising a first electrode, a solid precursor material for the production of silane in contact with the first electrode, means for generating a supply of $H^+$ ions, a second electrode, and a receptacle for retaining an electrolyte.

9. An apparatus for fabrication of an article having at least one region including elemental silicon, a silicon alloy, or a silicon compound, the apparatus comprising:

a reaction chamber for deposition of elemental silicon, a silicon alloy, or a silicon compound, the reaction chamber including a component for dissociation of a silane, the dissociation component selected from heating elements, plasma-generating electrodes, microwave plasma generators, and photolyzers;

a gas supply line connected to the reaction chamber for supplying a silane to the reaction chamber; and an electrochemical cell communicating with the gas supply line, the electrochemical cell comprising a first electrode, a packed bed electrode comprising precursor material including silicon for the production of silane positioned adjacent a second electrode, an ion exchange membrane positioned between the first and second electrodes, and a receptacle for retaining an electrolyte.

* * * * *